(12) United States Patent
Yang et al.

(10) Patent No.: US 8,796,831 B2
(45) Date of Patent: Aug. 5, 2014

(54) COMPLEX SEMICONDUCTOR PACKAGES AND METHODS OF FABRICATING THE SAME

(75) Inventors: Gwi-gyeon Yang, Gyeonggi-do (KR); Seung-won Lim, Gyeonggi-do (KR)

(73) Assignee: Fairchild Korea Semiconductor, Ltd., Wonmi-District, Buncheon, Kyonggi Province (KR)

( * ) Notice: Subject to any disclaimer, the term of this patent is extended or adjusted under 35 U.S.C. 154(b) by 93 days.

(21) Appl. No.: 12/413,399

(22) Filed: Mar. 27, 2009

(65) Prior Publication Data
US 2009/0243061 A1 Oct. 1, 2009

(30) Foreign Application Priority Data
Mar. 31, 2008 (KR) .......................... 10-2008-0029918

(51) Int. Cl.
*H01L 23/495* (2006.01)
(52) U.S. Cl.
USPC ........................... 257/676; 257/688; 257/723
(58) Field of Classification Search
USPC .................................. 257/723, 703, 676, 688
See application file for complete search history.

(56) References Cited

U.S. PATENT DOCUMENTS

| | | | | |
|---|---|---|---|---|
| 5,291,065 A | * | 3/1994 | Arai et al. | 257/723 |
| 5,818,105 A | * | 10/1998 | Kouda | 257/696 |
| 6,144,571 A | * | 11/2000 | Sasaki et al. | 363/144 |
| 6,313,598 B1 | * | 11/2001 | Tamba et al. | 318/722 |
| 2006/0102994 A1 | * | 5/2006 | Pu | 257/686 |
| 2009/0174044 A1 | * | 7/2009 | Eom et al. | 257/675 |

FOREIGN PATENT DOCUMENTS

JP 2000245170 A 9/2000

\* cited by examiner

*Primary Examiner* — Phat X Cao
(74) *Attorney, Agent, or Firm* — Kenneth E. Horton; Kirton McConkie

(57) ABSTRACT

Disclosed are complex semiconductor packages, each including a large power module package which includes a small semiconductor package, and methods of manufacturing the complex semiconductor packages. An exemplary complex semiconductor package includes a first package including: a first packaging substrate; a plurality of first semiconductor chips disposed on the first packaging substrate; and a first sealing member covering the first semiconductor chips on the first packaging substrate; and at least one second package separated from the first packaging substrate, disposed in the first sealing member, and including second semiconductor chips.

22 Claims, 8 Drawing Sheets

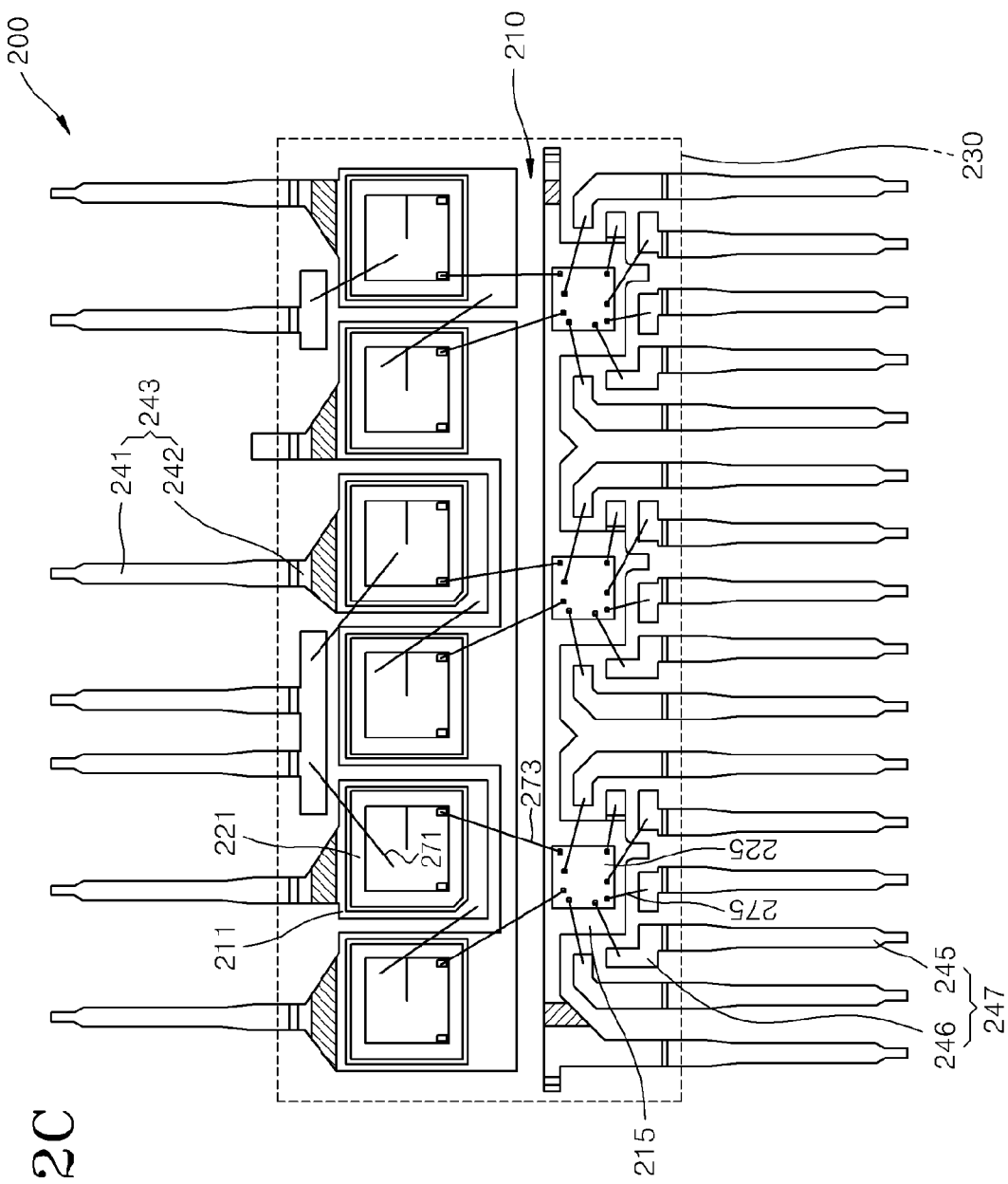

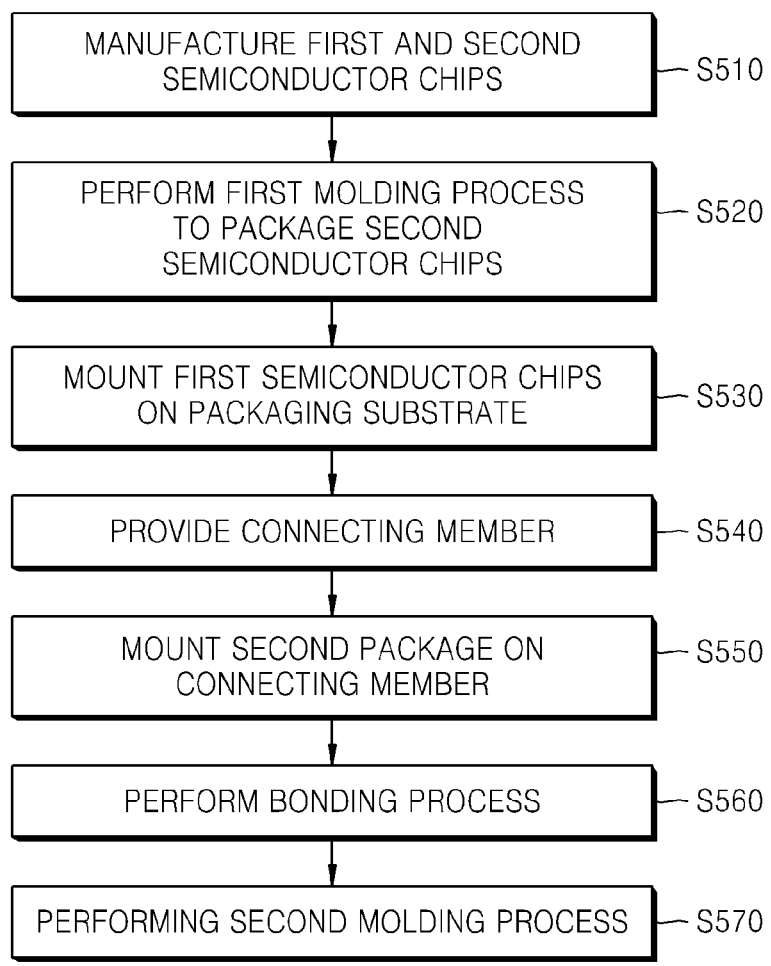

COMPLEX SEMICONDUCTOR PACKAGES AND METHODS OF FABRICATING THE SAME

CROSS-REFERENCES TO RELATED APPLICATIONS

This application claims the benefit of Korean Patent Application No. 10-2008-0029918, filed on Mar. 31, 2008, in the Korean Intellectual Property Office, the disclosure of which is incorporated herein in its entirety by reference.

BACKGROUND OF THE INVENTION

1. Field of the Invention

The present invention relates to semiconductor packages, and more particularly, to complex semiconductor packages, each comprising a power module package which comprises a small package performing a different function and having a different electrical capacity than the power module package. The electrical capacity may comprise a voltage-handling capacity, a current-handling capacity, and/or a power-handling capacity.

2. Description of the Related Art

In general, a semiconductor package is fabricated by mounting at least one semiconductor chip on a lead frame or a printed circuit board (PCB), and sealing the semiconductor chips with a sealing resin, and is then used by mounting it on a motherboard or a PCB. As the demand for high-spec electronic devices having high-speed performance, large electrical capacity, and high integration increases, power devices applied to electrical devices are manufactured to be smaller, more lightweight, and multi-functional. For example, power module packages in which a plurality of semiconductor chips are mounted are widely used. Specifically, a power module package includes power semiconductor chips and/or control semiconductor chips.

However, in a power module package, there is a limitation on multi-functionalization due to a limited number of leads, that is, output terminals used to connect to an external device. In addition, there is a limitation on the semiconductor chips that can be included in the power module package, which can prevent various electrical capacities and functions from being obtained.

SUMMARY OF THE INVENTION

The present invention provides complex semiconductor packages, where a small package is packaged in module package (such as a high voltage power module package) for each complex semiconductor package, and methods of fabricating the same.

According to an aspect of the present invention, there is provided a complex semiconductor package where at least one small package is disposed (e.g., mounted) in a larger module package, which may comprise a high voltage power module package. The complex semiconductor package comprises a first package which includes a first packaging substrate, one or more first semiconductor chips disposed on the first packaging substrate, and a first sealing member covering the first semiconductor chips on the first packaging substrate, and at least one second package which is separated from the first packaging substrate, and disposed in the first sealing member, and includes one or more second semiconductor chips.

The complex semiconductor package may further comprise a connecting member disposed in the first sealing member and located separately from the first packaging substrate. The second package is disposed (e.g., mounted) on the connecting member. The connecting member may comprise a printed circuit board (PCB). The first packaging substrate may comprise a direct bond copper (DBC) substrate or an insulated metal substrate (IMS).

The first package may further comprise first leads which are partially exposed by the first sealing member and are electrically connected to the first packaging substrate and second leads which are partially exposed by the first sealing member and electrically connected to the connecting member. The second package may further comprise a second packaging substrate on which the one or more second semiconductor chips are disposed, third and fourth leads electrically connected to the one or more second semiconductor chips, and a second sealing member covering the second semiconductor chips and the second packaging substrate. The first and second sealing members may comprise an epoxy molding compound. The second packaging substrate may comprise a ceramic substrate.

The second package may further comprise a lead frame, wherein the one or more second semiconductor chips are disposed on one or more chip pad portions of the lead frame, third and fourth leads electrically connected to the one or more second semiconductor chips, and a second sealing member completely covering the second semiconductor chips and the lead frame, and partially covering the third and fourth leads to expose a portion of each of the third and fourth leads. The first sealing member may completely cover the second sealing member. The second package may be disposed (e.g., mounted) on a surface of the connecting member and the exposed portion of each of the third and fourth leads is electrically connected to the connecting member. The second package may be disposed (e.g., mounted) on a surface of the connecting member and the exposed portion of each of the third and fourth leads may be exposed by the first sealing member. The second package may comprise a dual in-line type package, and the exposed portion of each of the third and fourth leads may penetrate through the connecting member and is exposed by the first sealing member.

The second package may perform a different function from that of the first package and may have a different electrical capacity from that of the first package, and the first and second packages may be operated independently (such as in separate circuits), or may operate together in a common circuit. The first package may comprise a power module package comprising at least one power semiconductor chip, and the second package may comprise a signal module package comprising a driver IC and a transistor IC. The at least one power semiconductor chip may be electrically connected to the connecting member via a wire formed of Al or Au.

According to another aspect of the present invention, there is provided a complex semiconductor package. A plurality of semiconductor chips are disposed on a first surface of the packaging substrate. A connecting member is separated from the packaging substrate. At least one package comprising third and fourth leads is disposed on the connecting member. First leads are connected to the packaging substrate. Second leads are connected to the connecting member. A sealing member covers the packaging substrate excluding a second surface of the packaging substrate opposite to the first surface thereof, the connecting member, the at least one package, and a portion of each of the first and second leads.

According to another aspect of the present invention, there is provided a method of fabricating a complex semiconductor package having one or more first semiconductor chips, one or more second semiconductor chips, a first package, and a second package disposed in the first package. A first molding process is performed to package the one or more second semiconductor chips in the second package. The first semiconductor chips are disposed (e.g., mounted) on a first surface of a packaging substrate. The second package is disposed (e.g., mounted) on a connecting member. The connecting member is arranged to be spaced apart from the packaging substrate, and a bonding process is performed such that leads are connected to the packaging substrate and the connecting member and such that the connecting member is electrically connected to at least one first semiconductor chip. A second molding process is performed to form a sealing member covering the first surface of the packaging substrate, the second package, the connecting member, and the leads, thereby manufacturing a first package which the second package is packaged in.

BRIEF DESCRIPTION OF THE DRAWINGS

The above and other features and advantages of the present invention will become more apparent by describing in detail exemplary embodiments thereof with reference to the attached drawings in which:

FIG. 2C is a plan view of an inverter module package according to an exemplary embodiment of the present invention;

FIG. 5 is a flowchart illustrating a method of fabricating a complex semiconductor package, according to an exemplary embodiment of the present invention.

DETAILED DESCRIPTION OF THE INVENTION

Figure 1A:
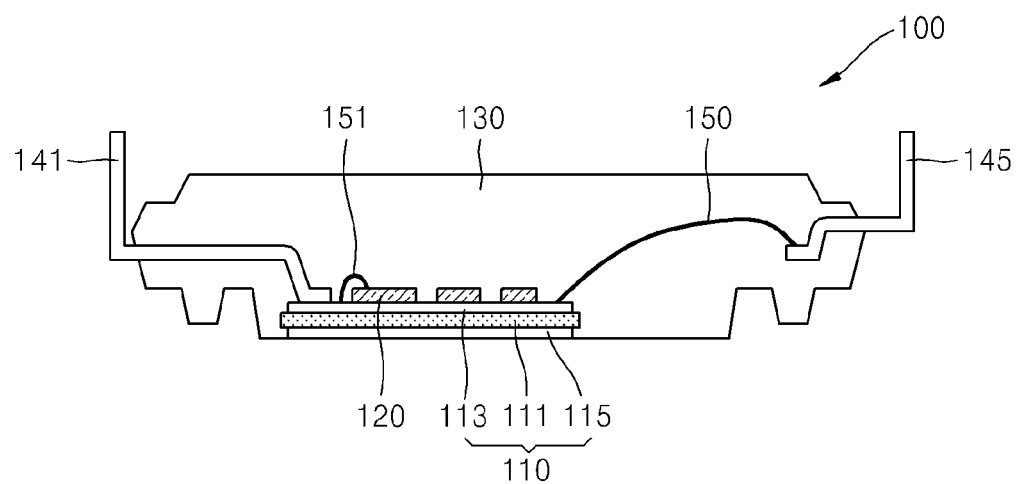
FIG. 1A is a cross-sectional view of a power module package according to an exemplary embodiment of the present invention.

It will be understood that when a layer or other element is referred to as being "on" another layer or substrate or element, it can be directly on the other layer or substrate or element, or intervening layers and elements may also be present. In the drawings, the thicknesses and sizes of layers, regions, and elements may be exaggerated for clarity, and like reference numerals in the drawings denote like elements. It will also be understood that when an element, such as a layer, a region, a wire, a lead, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to", "directly coupled to", or "directly electrically connected to" another element, there are no intervening elements present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 1B:
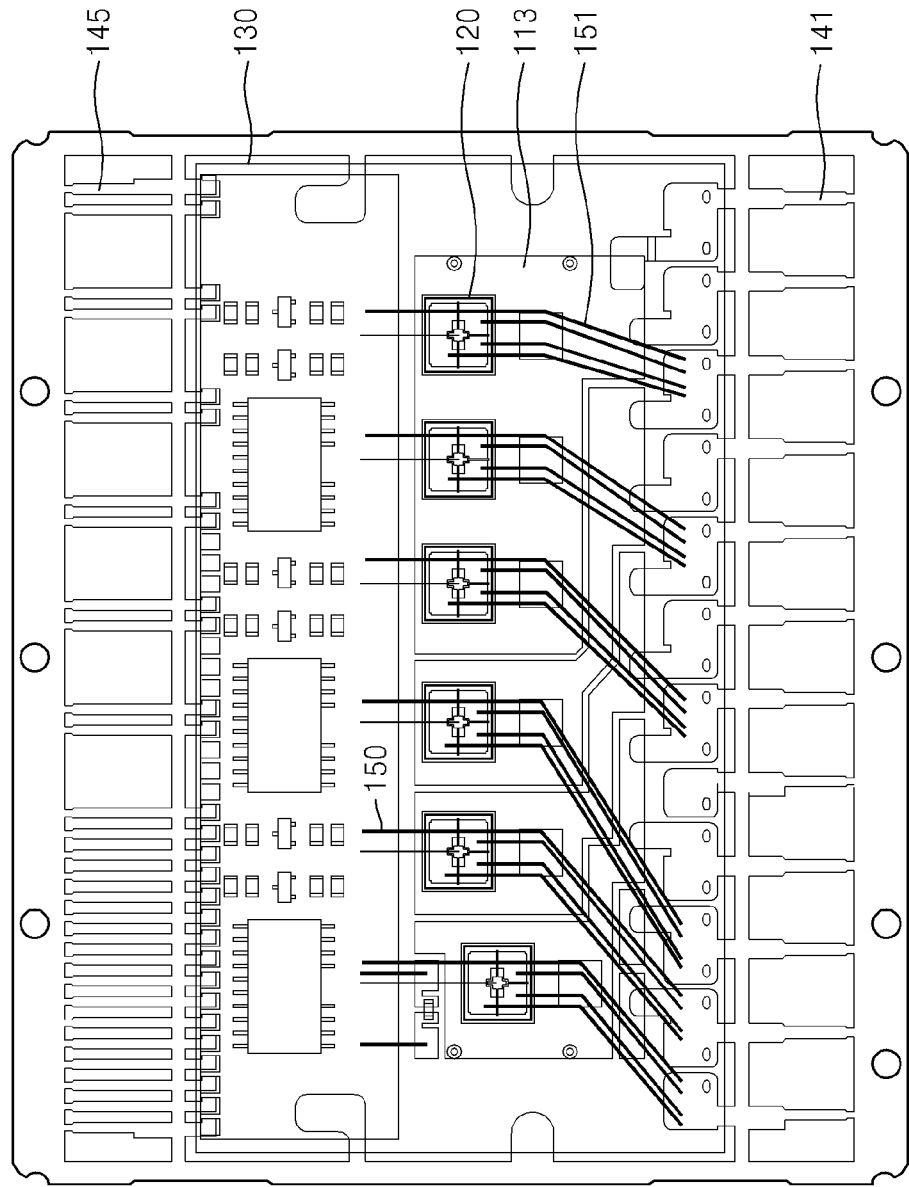
FIG. 1B is a plan view of the power module package of FIG. 1A according to an exemplary embodiment of the present invention.

FIG. 1A is a cross-sectional view of a power module package 100 according to an embodiment of the present invention, and FIG. 1B is a plan view of the power module package 100 according to the current embodiment of the present invention before an epoxy molding process is performed. In FIGS. 1A and 1B, a portion in which semiconductor chips 120 are disposed is schematically illustrated.

Referring to FIGS. 1A and 1B, the power module package 100 includes a packaging substrate 110 and semiconductor chips 120 disposed on the packaging substrate 110. The packaging substrate 110 may include a direct bond copper (DBC) substrate. The packaging substrate 110 may include a ceramic insulating layer 111, a top conductive layer 113 disposed on an upper surface of the ceramic insulating layer 111, and a bottom conductive layer 115 disposed on a lower surface of the ceramic insulating layer 111. The ceramic insulating layer 111 may include an $Al_2O_3$ layer, an AlN layer, a $SiO_2$ layer, or a BeO layer. Each of the top conductive layer 113 and the bottom conductive layer 115 may include a Cu layer. The top conductive layer 113 may include conductive layer patterns which are electrically separated from each other.

The semiconductor chips 120 may include power semiconductor chips and/or control semiconductor chips. The semiconductor chips 120 may be attached to the top conductive layer 113 of the packaging substrate 110 with an adhesive such as a solder pad or an Au epoxy (not shown). First leads 141 may be electrically connected to the top conductive layer 113 of the packaging substrate 110 with solder (not shown), and second leads 145 may be electrically connected to the top conductive layer 113 via a first wire 150. Meanwhile, the semiconductor chips 120, for example control semiconductor chips, are disposed on chip pad portions of a lead frame (not shown). The semiconductor chips 120 may be connected to the top conductive layer 113 of the packaging substrate 110 via wires (not shown), and the semiconductor chips 120 may be connected to the second leads 145 via the first wire 150.

The semiconductor chips 120 may be electrically connected to the top conductive layer 113 via a second wire 151. A sealing member 130 covers the semiconductor chips 120, portions of the first and second leads 141 and 145, and the packaging substrate 110 (excluding one surface of the bottom conductive layer 115). When required, a heat sink (not shown) dissipating heat emitted from the semiconductor chips 120 may be attached to the surface of the bottom conductive layer 115.

The packaging substrate 110 may comprise an insulated metal substrate (IMS). The IMS may include, for example, a base member, an insulating layer disposed on the base member, and a conductive layer disposed on the insulating layer. The base member may comprise an aluminum (Al) plate having excellent heat dissipating characteristics. The insulating layer may comprise an epoxy resin having excellent heat-resisting and insulating characteristics. The conductive layer may comprise a metal layer with high conductivity, for example, a metal layer formed of Cu, Au, Ag, Al, or Ni. The conductive layer may include metal patterns which are electrically separated from each other.

Figure 2A:
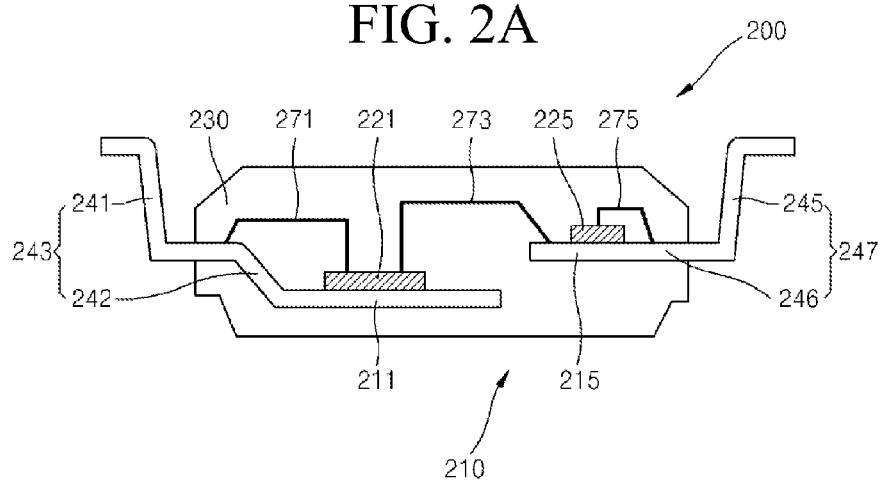
FIGS. 2A and 2B are cross-sectional views of an inverter module package according to an exemplary embodiment of the present invention.
Figure 2B:
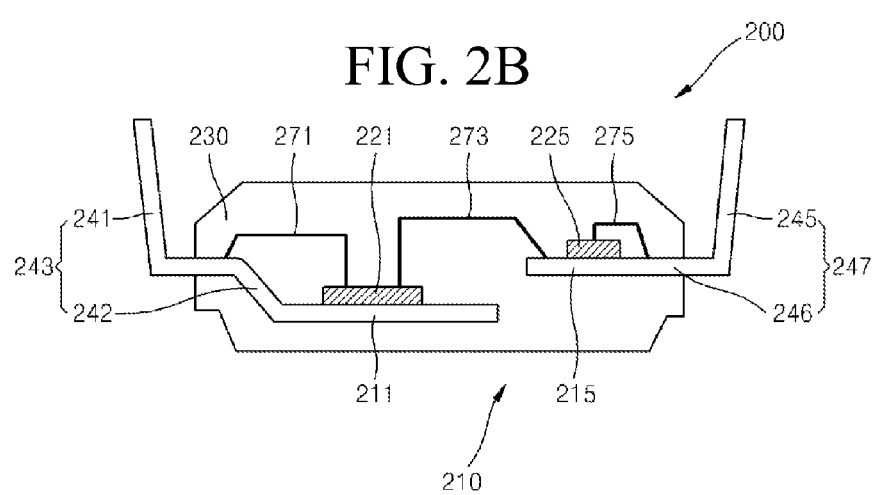

FIGS. 2A and 2B are cross-sectional views of an inverter module package 200 for driving a motor according to an embodiment of the present invention. FIG. 2C is a plan view of the inverter module package 200 before an epoxy molding process is performed according to the current embodiment of the present invention. FIGS. 2A and 2B are sectional views going through one of a plurality of driving devices 221 and one of a plurality of drivers 225 illustrated in FIG. 2C.

Referring to FIGS. 2A-2C, the inverter module package 200 includes a plurality of driving devices 221 providing motor driving signals to drive a motor, for example, a 3-phase motor and a plurality of drivers 225 providing driving signals to drive the driving devices 221. Specifically, the inverter module package 200 includes six driving devices 221 for driving a 3-phase motor and three drivers 225 for driving the driving devices 221. The six driving devices may include two driving devices 221 for driving a U-phase of the motor, two driving devices 221 for driving a V-phase of the motor, and two driving devices 221 for driving a W-phase of the motor. The driving devices 221 may include transistors, for example, MOS transistors. The drivers 225 may include inverters.

The inverter module package 200 may include a lead frame 210. The lead frame 210 includes first chip pad portions 211, second chip pad portions 215, first leads 243, and second leads 247. The driving devices 221 are disposed (e.g., mounted) on the first chip pad portions 211, and the drivers 225 are disposed (e.g., mounted) on the second chip pad portions 215. Each of the first leads 243 includes a first inner lead 242 connected to the first chip pad portions 211 and a first outer lead 241 connected to the first inner lead 242, and each of the second leads 247 includes a second inner lead 246 connected to the second chip pad portion 215 and a second outer lead 245 connected to the second inner lead 246. One or more first leads 243 and the first chip pad portions 211 may be formed together as one body, and/or one or more first leads 243 may be separated from the first chip pad portions 211. Similarly, one or more second leads 247 and the second chip pad portion 215 may be formed together as one body, and/or one or more second leads 247 may be separated from the second chip pad portion 215. The first and second outer leads 241 and 245 may have a linear end portion, which is suitable for a dual in-line package, or may have a bent end portion, which is suitable for a surface mount device (SMD).

Figure 2D:
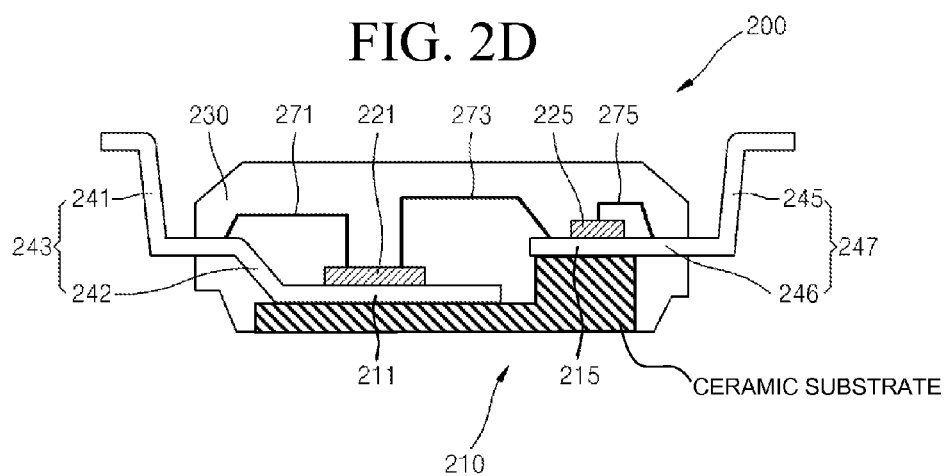
FIG. 2D is cross-sectional views of another inverter module package according to an exemplary embodiment of the present invention.

In the inverter module package 200, the lead frame 210 may be disposed on a ceramic substrate and the driving devices 221 and the drivers 225 may be disposed on the first and second chip pad portions 211 and 215 on the lead frame 210 on the ceramic substrate, as shown in the embodiment of FIG. 2D.

In a complex semiconductor package according to the present invention, a second package is disposed (e.g., mounted) in a first package, wherein the second package has a smaller electrical capacity and a smaller size than the first package and performs a different function from the first package. As indicated above, the electrical capacity may comprise a voltage-handling capacity (measured in volts), a current-handling capacity (measured in amperes), a power-handling capacity (measured in watts), or a combination of these. Therefore, the complex semiconductor package can perform various functions and have various electrical capacities. A complex semiconductor package according to an embodiment of the present invention may be obtained by mounting the inverter module package 200 of FIGS. 2A-2C in the power module package 100 of FIGS. 1A-1B. As compared with the conventional power module package 100 and the inverter module package 200 driving a motor with high voltage power supplied from the power module package 100 that are individually disposed (e.g., mounted) on a motherboard or a PCB substrate, a complex semiconductor package according to the present invention can decrease a number of components, thereby reducing total thickness of the package, can perform various functions and can have various electrical capacities within one package. Also, the first package and the second package can be simultaneously or independently driven (e.g., the first and second packages may operate together in a common circuit, or may operate in separate circuits).

Figure 3A:
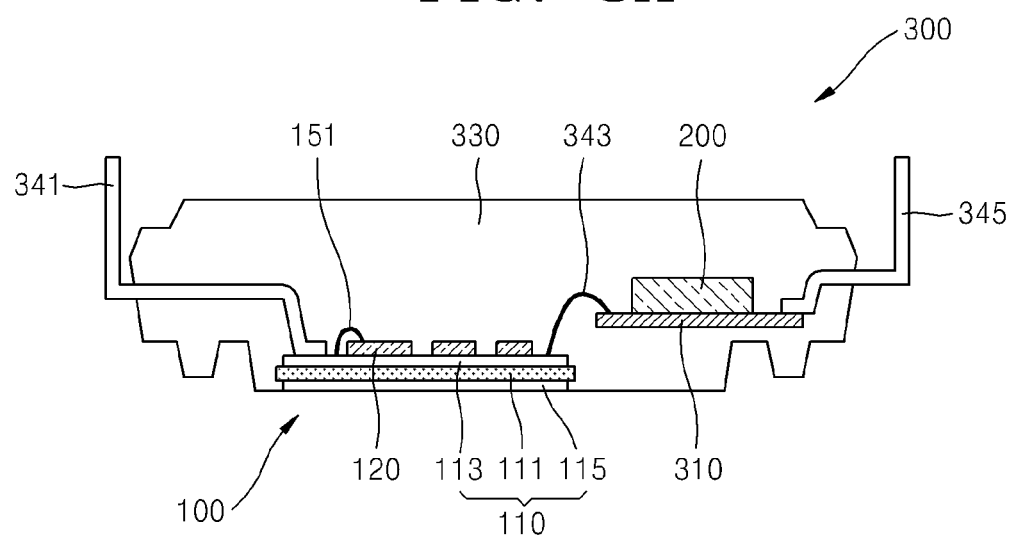
FIG. 3A is a cross-sectional view of a complex semiconductor package according to an exemplary embodiment of the present invention.
Figure 3B:
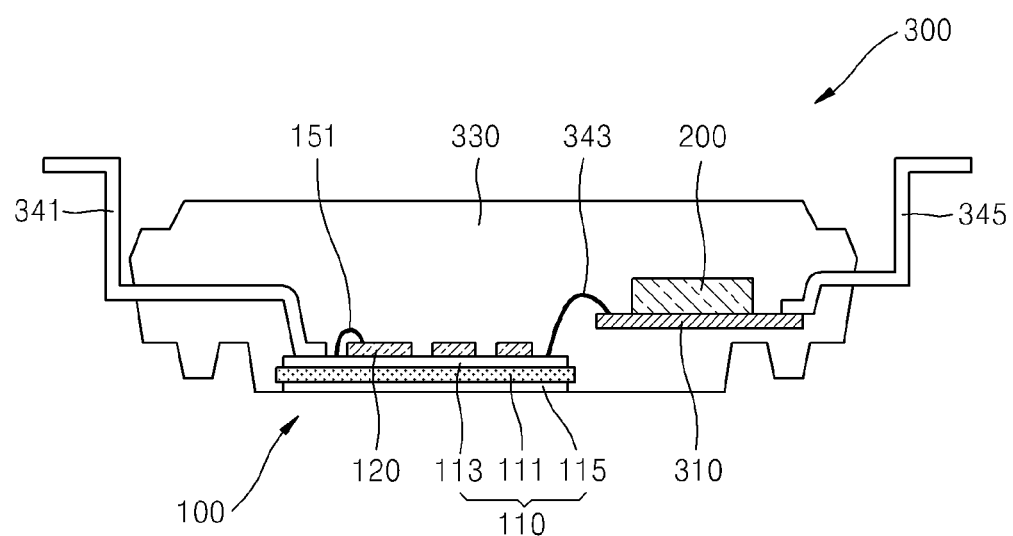
FIG. 3B is a cross-sectional view of a complex semiconductor package according to another exemplary embodiment of the present invention.

FIGS. 3A and 3B are cross-sectional views of a complex semiconductor package 300 according to embodiments of the present invention. Referring to FIGS. 3A and 3B, the complex semiconductor package 300 includes a first package 100 and a second package 200 disposed within the first package 100. The second package 200 may have a different electrical capacity from the first package 100. For example, the first package 100 may include a high current-handling capacity package with a capacity of 10-1000 A (amperes), and the second package 200 may include a low current-handling capacity package with a capacity of 1-10 A. The second package 200 may include a package performing a different function from the first package 100. For example, the first package 100 may be a power module package, and the second package 200 may be an inverter module package.

Referring to FIGS. 3A and 3B, the first package 100 includes a packaging substrate 110 and a plurality of semiconductor chips 120 disposed on the packaging substrate 110. The packaging substrate 110 may include a ceramic insulating layer 111, a top conductive layer 113 disposed on an upper surface of the ceramic insulating layer 111, and a bottom conductive layer 115 disposed on a lower surface of the ceramic insulating layer 111. The semiconductor chips 120 may include power semiconductor chips and/or control semiconductor chips. The second package 200 may comprise a signal module package. For example, the second package 200 may comprise the inverter module package of FIG. 2A or FIG. 2B. The semiconductor chips 120 disposed on the lead frame 210 of the second package 200 in FIGS. 2A and 2B may include driver ICs 225 or transistor ICs 221.

The complex semiconductor package 300 may further include a connecting member 310 electrically connecting the first package 100 to the second package 200. The connecting member 310 may include a PCB substrate. The second package 200 is disposed (e.g., mounted) on the connecting member 310. The connecting member 310 may be electrically connected to the top conductive layer 113 of the packaging substrate 110 or to the semiconductor chips 120, via a wire 343 formed of a conductive material, such as Al or Au. First leads 341 may be electrically connected to the top conductive layer 111 of the packaging substrate 110 with solder (not shown), and second leads 345 may be electrically connected to the connecting member 310 with solder (not shown).

A first sealing member 330 may cover the semiconductor chips 120, the connecting member 310, the wires 343 and 151, a portion of each of the first and second leads 341 and 345, and the packaging substrate 110 (excluding a lower surface of the bottom conductive layer 115). The first sealing member 330 and a second sealing member 230 (shown in FIGS. 2A and 2B) may include an epoxy molding compound. A portion of each of the first and second leads 341 and 345 exposed by the first sealing member 330 may have a linear end portion or a bent end portion. In this regard, the first and second leads 341 and 345 of the complex semiconductor package 300 illustrated in FIG. 3A have linear end portions and the first and second leads 341 and 345 of the complex semiconductor package 300 illustrated in FIG. 3B have bent end portions.

Figure 4A:
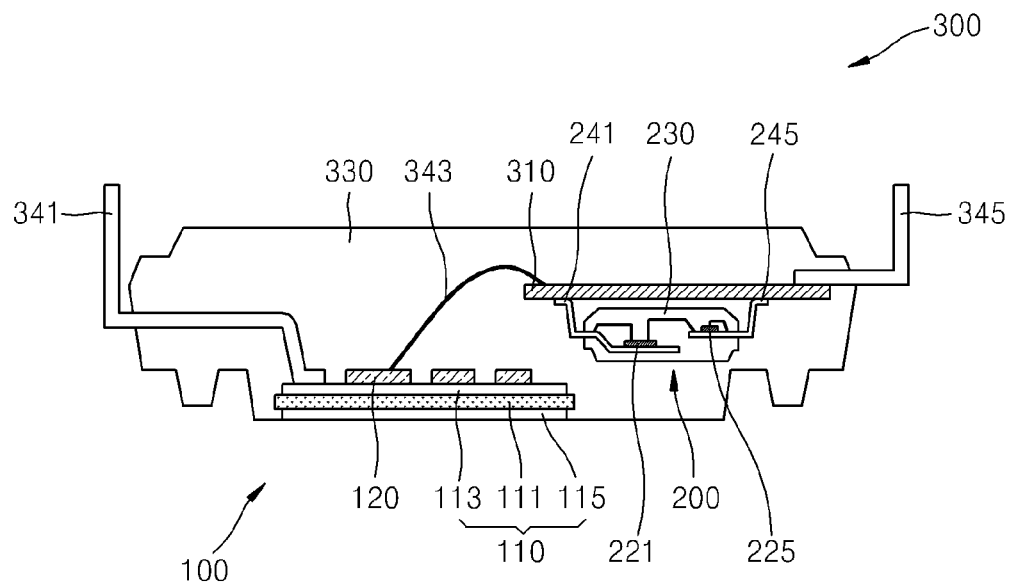
FIGS. 4A-4C are cross-sectional views illustrating a second package disposed (e.g., mounted) in a first package in a complex semiconductor package, according to exemplary embodiments of the present invention.
Figure 4B:
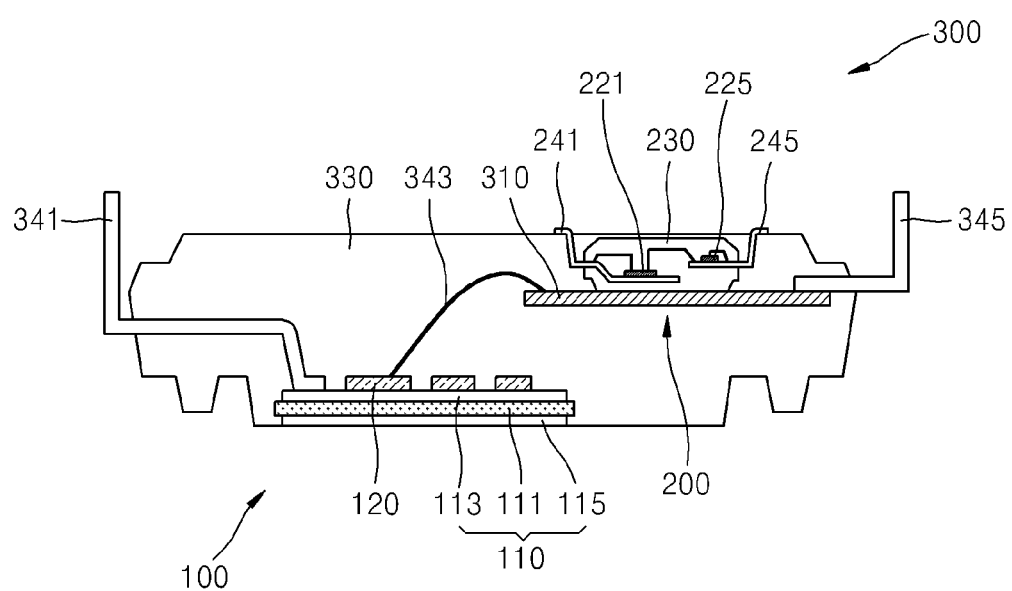
Figure 4C:
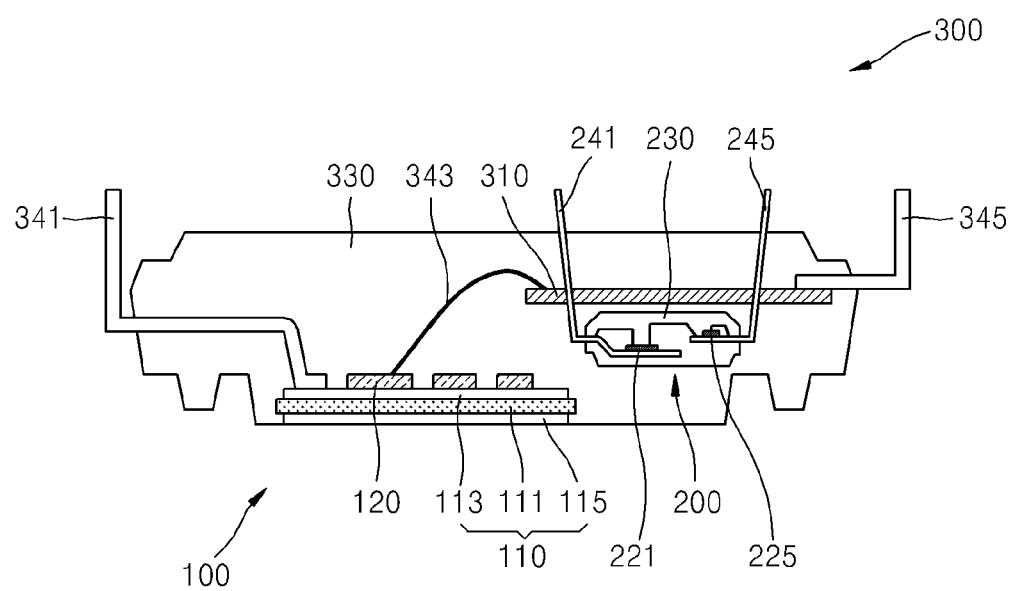

FIGS. 4A-4C are cross-sectional views illustrating the second package 200 disposed (e.g., mounted) in the first package 100 in the complex semiconductor package 300 of FIGS. 3A and 3B, according to embodiments of the present invention. Referring to FIG. 4A, the second package 200 of FIG. 2A may be disposed (e.g., mounted) on a lower surface of the connecting member 310 with a surface mount device type. The third and fourth leads 241 and 245 of the second package 200 may be electrically connected to the connecting member 310. An external signal may be applied to the third and fourth leads 241 and 245 of the second package 200 from the second leads 345 through the connecting member 310. Alternatively, the second package 200 can be disposed (e.g., mounted) on an upper surface of the connecting member 310.

Referring to FIG. 4B, the second package 200 of FIG. 2A may be disposed (e.g., mounted) on the upper surface of the connecting member 310. The second package 200 may be disposed (e.g., mounted) in such a way that the third and fourth leads 241 and 245 are not electrically connected to the connecting member 310 and are exposed by the first sealing member 330. An external signal may be applied to the second package 200 through the third and fourth leads 241 and 245. An external signal transmitted through the second leads 345 may not be provided to the second package 200 and may be transmitted to the semiconductor chips 120 of the first package 100 through the connecting member 310.

Referring to FIG. 4C, the second package 200 of FIG. 2A may be disposed (e.g., mounted) on the upper surface of the connecting member 310 with a dual in-line package type. Specifically, the second package 200 may be disposed (e.g., mounted) in such a way that the third and fourth leads 241 and 245 are electrically connected to the connecting member 310 and are exposed by the first sealing member 330. An external signal may be transmitted to the second package 200 through the third and fourth leads 241 and 245. Also, an external signal transmitted through the second leads 345 may be transmitted to the first package 100 and the second package 200 through the connecting member 310.

The first and second leads 341 and 345 of the complex semiconductor package 300 of FIGS. 4A-4C may have a bent end portion. The first package 100 and the second package 200 may be synchronously or independently operated (e.g., the first and second packages may operate together in a common circuit, or may operate in separate circuits). The second package 200 may include, in addition to an inverter module package, a package performing various functions and having different electrical capacities.

FIG. 5 is a flowchart illustrating a method of fabricating a complex semiconductor package 300, according to an exemplary embodiment of the present invention. Referring to FIGS. 4A-4C, and 5, first and second semiconductor chips 120, 221, and 225 are obtained (S510). The semiconductor chips may be received from an outside vendor or manufactured. The second semiconductor chips 221 and 225 are disposed (e.g., mounted) on the lead frame 210, and then a first molding process is performed to form the second sealing member 230 exposing a portion of each of the third and fourth leads 241 and 245 (S520). Therefore, the semiconductor chips 221 and 225 are packaged to form the second package 200. The first semiconductor chips 120 are disposed (e.g., mounted) on the packaging substrate 110 (S530).

Then, the connecting member 310, such as a PCB substrate, is provided (S540). The second package 200 is disposed (e.g., mounted) on the connecting member 310 in a surface mounting manner or a dual in-line packaging manner (S550). The connecting member 310 is separate from the packaging substrate 110, and the first and second leads 341 and 345 are disposed with respect to the first packaging substrate 110 and the connecting member 310. A bonding process is performed so that the first leads 341 are electrically connected to the top conductive layer 111 of the packaging substrate, the second leads 345 are electrically connected to the connecting member 310, and the connecting member 310 is electrically connected to the first semiconductor chips 120 via wires 343 formed of a conductive material, such as Al or Au (S560).

Then, a second molding process is performed to form the first sealing member 330 covering the packaging substrate 110 (excluding the bottom conductive layer 115), the connecting member 310, the wires 343, the second package 200, and a portion of each of the first and second leads 341 and 345 (S570). Accordingly, the first package, within which the second package is packaged, is manufactured, thereby completing the manufacture of the complex semiconductor package 300. Operations S510-S560 may be modified when required.

An exemplary complex semiconductor package according to the present invention includes at least one small package packaged in a larger package, where the larger package may comprise a high voltage-capacity and/or high current-capacity power module package. Therefore, packages performing various functions and having various electrical capacities can be disposed (e.g., mounted) in a single package. Therefore, a complex semiconductor package according to the present invention can perform various functions and have various electrical capacities, and the number of components used for the fabrication can be reduced, and the mounting rate can be increased.

Also, output terminals of the small package are exposed to the outside, independently from output terminals of the large-capacity high voltage power module package. Therefore, the number of output terminals can be increased, and thus, the complex semiconductor package can be formed to be small in size and multifunctional. When the small package is sealed with an epoxy molding compound, that is, a sealing member of the large-capacity high voltage power module package, the complex semiconductor package can generate less noise than when the large-capacity high voltage power module package and the small package are individually mounted on a motherboard or a PCB.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A complex semiconductor package comprising:
   a first package having a first packaging substrate, one or more first semiconductor chips disposed on the first packaging substrate, and a first single-material layer sealing member covering the one or more first semiconductor chips and all of the first packaging substrate except for a bottom surface thereof which remains exposed from the package; and
   at least one second package comprising one or more second semiconductor chips and a second sealing member covering the one or more second semiconductor chips, wherein the at least one second package is separated from the first packaging substrate, disposed in the first sealing member, and completely surrounded by the first sealing member.

2. The complex semiconductor package of claim 1, wherein the first packaging substrate comprises a direct bond copper substrate or an insulated metal substrate.

3. The complex semiconductor package of claim 1, further comprising a connecting member having a first surface and a second surface opposite to the first surface, the connecting member being separate from the first packaging substrate and disposed in the first sealing member such that the first sealing member covers at least a portion of each said surface of the connecting member, and wherein the second package is disposed on the connecting member.

4. The complex semiconductor package of claim 3, wherein the connecting member comprises a printed circuit board.

5. The complex semiconductor package of claim 3, wherein the first package further comprises:
   first leads that are partially exposed by the first sealing member and are electrically connected to the first packaging substrate; and
   second leads that are partially exposed by the first sealing member and electrically connected to the connecting member.

6. The complex semiconductor package of claim 5, wherein the second package further comprises:
   a second packaging substrate on which the one or more second semiconductor chips are disposed;
   third and fourth leads electrically connected to the one or more second semiconductor chips; and
   wherein the second sealing member further covers the second packaging substrate and partially covers the third and fourth leads to expose a portion of each of the third and fourth leads.

7. The complex semiconductor package of claim 6, wherein each of the first and second sealing members comprises an epoxy molding compound.

8. The complex semiconductor package of claim 6, wherein the second packaging substrate comprises a ceramic substrate.

9. The complex semiconductor package of claim 5, wherein the second package further comprises:
   lead frame, wherein the one or more second semiconductor chips are disposed on one or more chip pad portions of the lead frame;
   third and fourth leads electrically connected to the one or more second semiconductor chips; and
   wherein the second sealing member completely covers the one or more second semiconductor chips and the lead frame and partially covers the third and fourth leads to expose a portion of each of the third and fourth leads.

10. The complex semiconductor package of claim 9, wherein the second package is disposed on a surface of the connecting member and the exposed portion of each of the third and fourth leads is electrically connected to the connecting member.

11. The complex semiconductor package of claim 9, wherein the second package is disposed on a surface of the connecting member and the exposed portion of each of the third and fourth leads is exposed by the first sealing member.

12. The complex semiconductor package of claim 9, wherein the second package comprises a dual in-line type package, and the exposed portion of each of the third and fourth leads penetrates through the connecting member and is exposed by the first sealing member.

13. The complex semiconductor package of claim 1, wherein the second package performs a different function from the first package and has a different electrical capacity from the first package, and wherein the first and second packages are operated independently.

14. The complex semiconductor package of claim 13, wherein the first package comprises a power module package comprising at least one power semiconductor chip, and the second package comprises a signal module package comprising a driver IC and a transistor IC.

15. The complex semiconductor package of claim 1, wherein at least one first semiconductor chip is electrically connected to the connecting member via a wire formed of Al or Au.

16. The complex semiconductor package of claim 1, further comprising an exposed outer surface; and wherein a portion of the first sealing member is disposed at the exposed outer surface.

17. The complex semiconductor package of claim 1, further comprising leads that are partially exposed outside of the complex semiconductor package.

18. A complex semiconductor package comprising:
a packaging substrate having a first surface and a second surface;
a plurality of first semiconductor chips disposed on the first surface of the packaging substrate;
a connecting member separately disposed from the packaging substrate;
a plurality of first leads connected to the packaging substrate;
a plurality of second leads connected to the connecting member;
a first single-material layer sealing member; and
at least one package disposed on the connecting member, the at least one package comprising third and fourth leads, one or more second semiconductor chips, and a second sealing member covering the one or more second semiconductor chips; and
wherein the first sealing member covers the first surface and sides of the packaging substrate, the connecting member, the at least one package, and a portion of each of the first and second leads, but does not cover at least a portion of the second surface of the packaging substrate which remains exposed from the package, and wherein the first sealing member completely surrounds the at least one package.

19. The complex semiconductor package of claim 18, wherein the connecting member comprises a printed circuit board (PCB).

20. The complex semiconductor package of claim 18, wherein the at least one package disposed on the connecting member is a surface mount-type package or a dual inline-type package, and the third and fourth leads are partially or completely covered by the first sealing member.

21. The complex semiconductor package of claim 18, wherein the at least one package performs a different function from that of the semiconductor chips and has a different electrical capacity from that of the semiconductor chips, and wherein the at least one package and the semiconductor chips are operated independently.

22. The complex semiconductor package of claim 18, further comprising an exposed outer surface; and wherein a portion of the first sealing member is disposed at the exposed outer surface.

* * * * *